United States Patent
Grillberger et al.

(10) Patent No.: US 8,501,545 B2
(45) Date of Patent: Aug. 6, 2013

(54) REDUCTION OF MECHANICAL STRESS IN METAL STACKS OF SOPHISTICATED SEMICONDUCTOR DEVICES DURING DIE-SUBSTRATE SOLDERING BY AN ENHANCED COOL DOWN REGIME

(75) Inventors: Michael Grillberger, Radebeul (DE); Matthias Lehr, Dresden (DE); Rainer Giedigkeit, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 46 days.

(21) Appl. No.: 12/963,134

(22) Filed: Dec. 8, 2010

(65) Prior Publication Data

US 2011/0244632 A1 Oct. 6, 2011

(30) Foreign Application Priority Data

Mar. 31, 2010 (DE) .......................... 10 2010 003 562

(51) Int. Cl.
*H01L 21/60* (2006.01)
*B23K 3/08* (2006.01)
*B23K 3/04* (2006.01)

(52) U.S. Cl.
USPC .... 438/121; 257/778; 257/780; 257/E21.506; 257/E21.508; 257/E21.511; 257/E23.021; 438/612; 438/613; 228/46

(58) Field of Classification Search
USPC .................. 257/778, 780, E21.506, E21.508, 257/E21.511, E23.021; 438/121, 612, 613; 228/46
See application file for complete search history.

(56) References Cited

U.S. PATENT DOCUMENTS 6,245,583 B1 6/2001 Amador et al. ................. 438/14
6,977,429 B2 12/2005 Odegard et al. ............... 257/685

OTHER PUBLICATIONS

Translation of Official Communication from German Patent Office for German Patent Application No. 10 2010 003 562.9-33 dated Jan. 14, 2011.

*Primary Examiner* — Peniel M Gumedzoe
(74) *Attorney, Agent, or Firm* — Williams, Morgan & Amerson, P.C.

(57) ABSTRACT

In a reflow process for connecting a semiconductor die and a package substrate, the temperature gradient and thus the thermally induced mechanical forces in a sensitive metallization system of the semiconductor die may be reduced during the cooling phase. To this end, one or more heating intervals may be introduced into the cooling phase, thereby efficiently reducing the temperature difference. In other cases, the central region may additionally be cooled by providing appropriate locally restricted mechanisms, such as a locally restricted gas flow and the like. Consequently, desired short overall process times may be obtain without contributing to increased yield losses when processing sophisticated metallization systems on the basis of a lead-free contact regime.

21 Claims, 8 Drawing Sheets

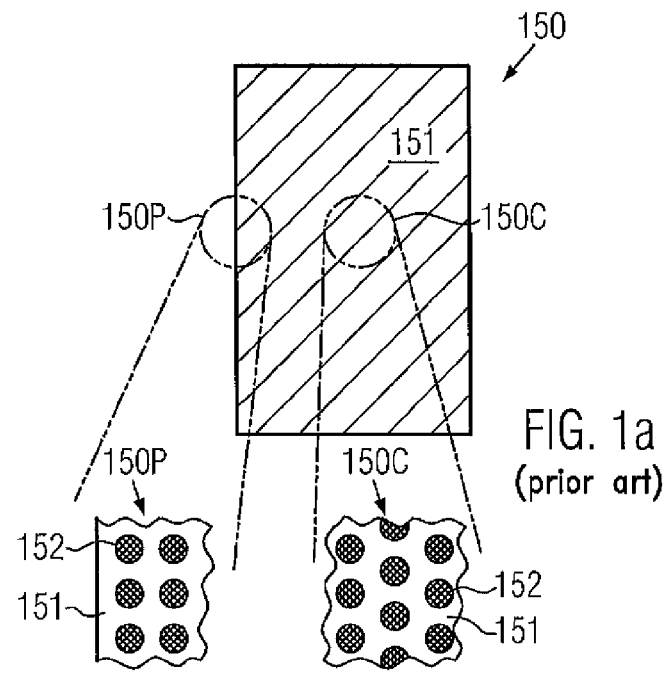
FIG. 1a (prior art)
FIG. 1b (prior art)
FIG. 1c (prior art)
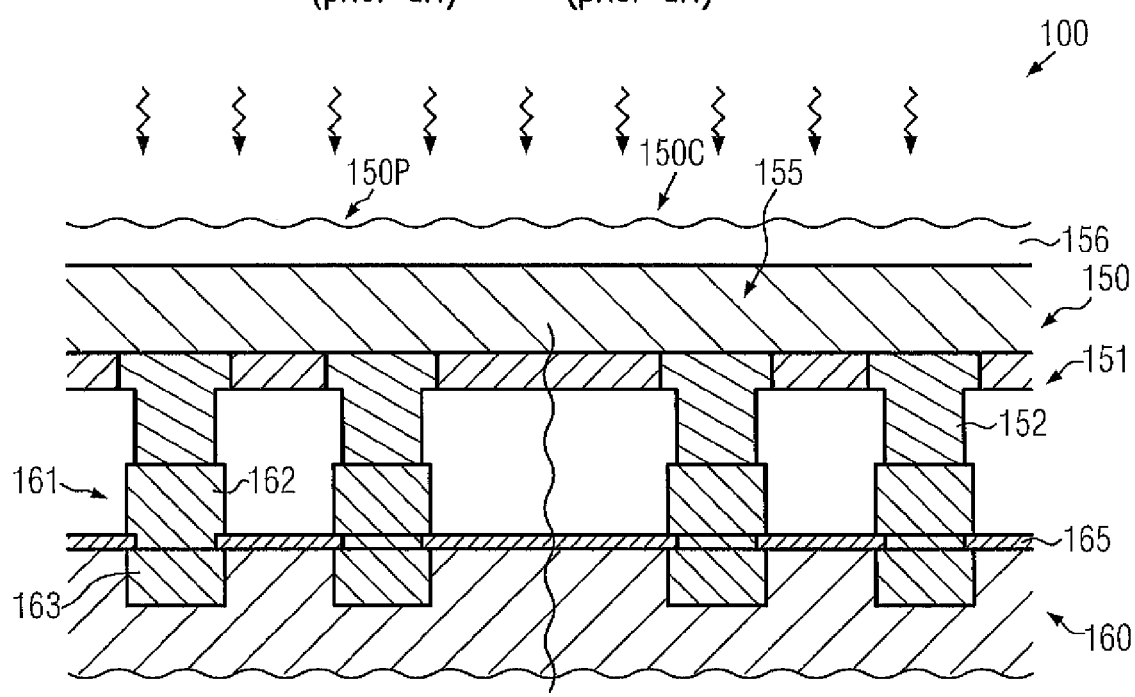
FIG. 1d (prior art)

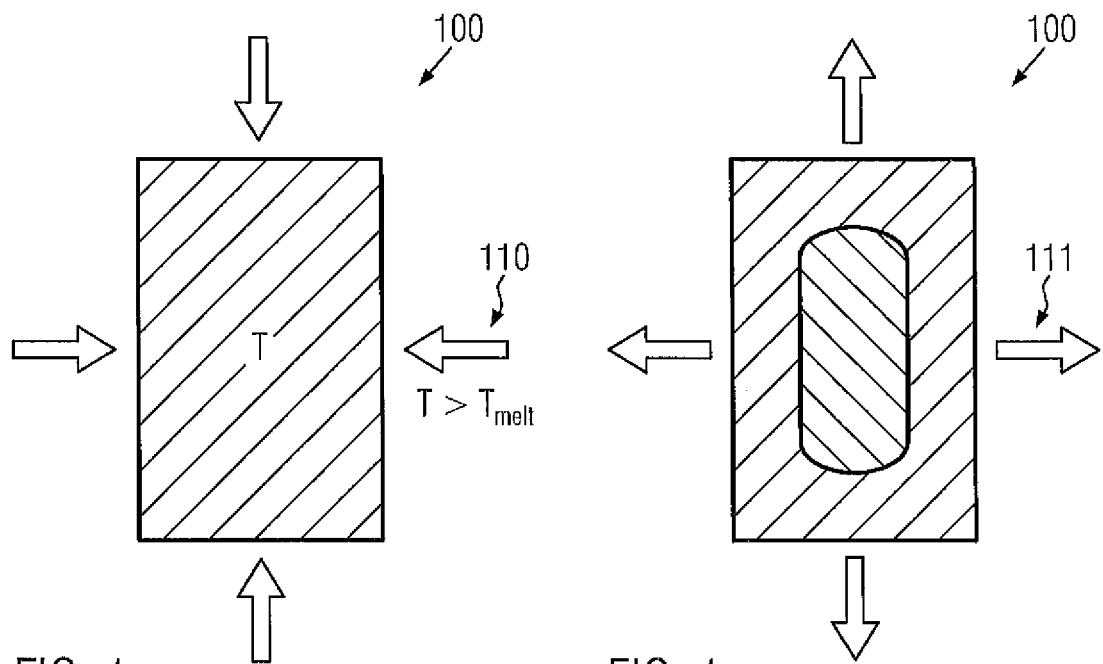
FIG. 1e
(prior art)
FIG. 1g
(prior art)
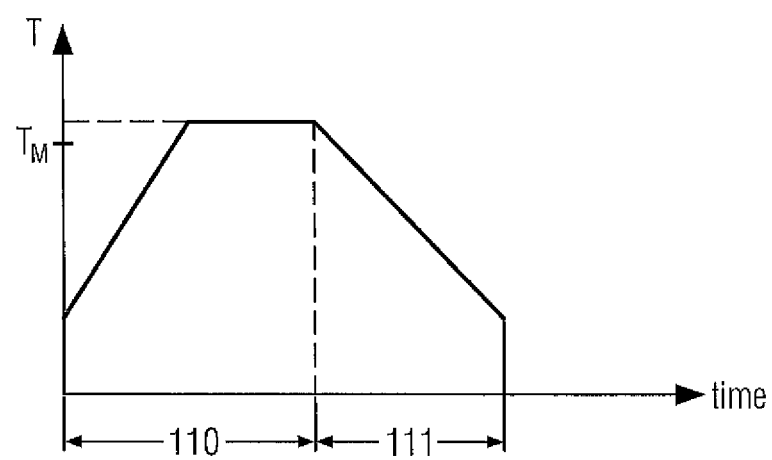
FIG. 1f
(prior art)

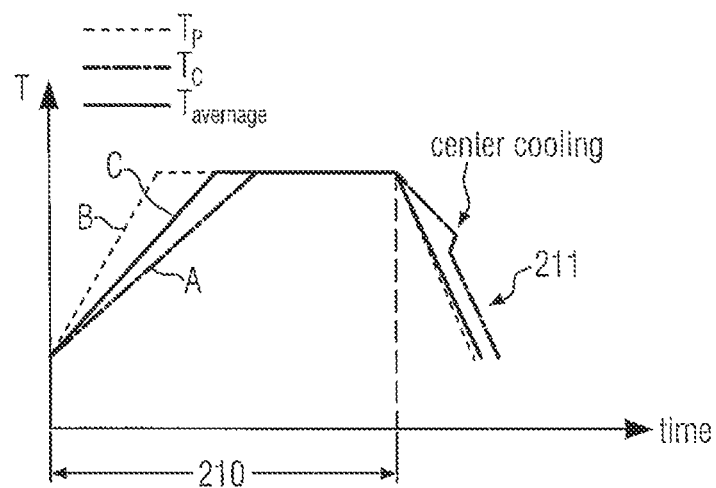
FIG. 2h
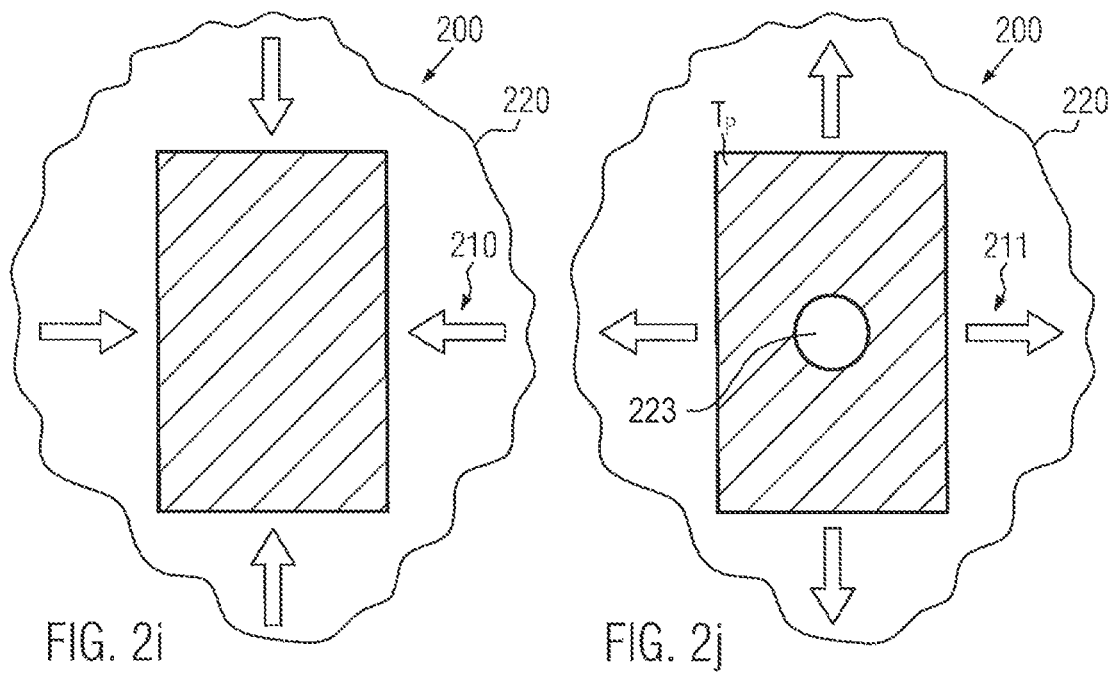
FIG. 2i
FIG. 2j ic characteristics of these sensitive dielectric materials and
their adhesion to other materials.

REDUCTION OF MECHANICAL STRESS IN METAL STACKS OF SOPHISTICATED SEMICONDUCTOR DEVICES DURING DIE-SUBSTRATE SOLDERING BY AN ENHANCED COOL DOWN REGIME

BACKGROUND OF THE INVENTION

1. Field of the Invention

Generally, the present disclosure relates to integrated circuits, and, more particularly, to sophisticated metallization systems including sensitive dielectric materials and lead-free bumps or metal pillars for connecting a chip to a package.

2. Description of the Related Art

Semiconductor devices, such as microprocessors, SRAMs, ASICs (application specific ICs), systems on chip (SoC) and the like, are typically formed on appropriate substrate materials, such as silicon and the like, wherein the individual integrated circuits are arranged in an array on a wafer so that most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economic constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the feature sizes of circuit elements are steadily scaled down. Due to this ongoing demand for shrinking the feature sizes of highly sophisticated semiconductor devices, copper, in combination with low-k dielectric materials, has become a frequently used alternative for the formation of so-called interconnect structures comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to implement the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased, in combination with a reduced conductivity of the lines due, to a reduced cross-sectional area. For this reason, traditional dielectrics such as silicon dioxide (k>4) and silicon nitride (k>7) are replaced by dielectric materials having a lower permittivity, which are, therefore, also referred to as low-k dielectrics, having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of these sensitive dielectric materials and their adhesion to other materials.

In addition to the problems of reduced mechanical stabilities of advanced dielectric materials having a dielectric constant of 3.0 and significantly less, device reliability may be affected by these materials during the final assembly of sophisticated semiconductor devices, due to an interaction between the chip and the package caused by a thermal mismatch of the corresponding thermal expansion of the different materials. For instance, in the fabrication of complex integrated circuits, increasingly a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump structure may be formed on the last metallization layer, which may be brought into contact with respective contact pads of the package that have formed thereon a solder material. Thus, after reflowing the bump material, a reliable electrical and mechanical connection may be established between the terminal metal formed on the last metallization layer and the contact pads of the package carrier. In this manner, a very large number of electrical connections may be provided across the entire chip area of the last metallization layer with reduced contact resistance and parasitic capacitance, thereby providing the I/O (input/output) capabilities which may be required for complex integrated circuits, such as CPUs, storage memories and the like. During the corresponding process sequence for connecting the bump structure with a package carrier, a certain degree of pressure and heat may be applied to the composite device so as to establish a reliable connection between each of the bumps formed on the chip and the bumps or pads that may be provided on the package substrate. The thermally or mechanically induced stress may, however, also act on the lower lying metallization layers, which may typically include low-k dielectrics or even ultra low-k (ULK) dielectric materials, thereby significantly increasing the probability of creating defects in the form of cracks, delamination and the like, due to the reduced mechanical stability and adhesion to other materials.

In particular, one prominent failure mechanism is seen in the phase when the package substrate is actually connected to the semiconductor die by reflowing the solder material and subsequently solidifying the solder material so as to form an inter-metallic connection between the bump structure of the semiconductor die and the bump structure of the package substrate. In this process, the semiconductor die and the package substrate are mechanically coupled to each other and are heated above the melting temperature of the solder material, thereby reflowing the solder material and forming an inter-metallic connection. Thereafter, the composite device, i.e., the semiconductor die and the package substrate, are cooled down, which, however, may result in a pronounced yield loss, as will be explained in more detail with reference to FIGS. 1a-1j.

FIG. 1a schematically illustrates a top view of a semiconductor die 150, which may be understood as a device comprising an appropriate carrier material, such as a silicon substrate, an insulating substrate and the like, in and above which circuit elements, such as transistors and the like, are provided. As discussed above, typically, the semiconductor die 150 comprises a metallization system including a plurality of metallization layers, when complex semiconductor devices are considered, in order to establish the connection between the individual semiconductor-based circuit elements. The metallization system (not shown) typically comprises a final metallization structure or contact structure 151, which comprises a plurality of contact elements, such as solder bumps, metal pillars and the like, which are to be connected to a complementary contact structure of a package substrate (not shown), as discussed above. The semiconductor die 150 may have any appropriate dimensions so as to accommodate one or more functional circuit portions, as required for obtaining the required operational behavior. As explained above, typically, the contact elements, such as the solder bumps, the metal pillars and the like, may be distributed across the entire surface area of the contact structure 151. Consequently, corresponding contact elements may typically be provided at any peripheral region 150P of the die 150 and also at a central region 150C.

FIG. 1b schematically illustrates an enlarged view of the peripheral region 150P, thereby schematically showing a plurality of contact elements 152, such as metal pillars in the form of copper pillars, solder bumps and the like, which may, in sophisticated applications, be provided in the form of a lead-free solder material and the like.

Similarly, FIG. 1c illustrates an enlarged view of the central region 150C, in which a plurality of solder bumps, metal pillars and the like 152 are provided in the contact structure 151. For example, in sophisticated applications, the lateral dimensions of the bumps or pillars 152 may be 100 um and less, depending on the I/O (input/output) requirements for corresponding circuits provided in the semiconductor die 150.

FIG. 1d schematically illustrates a cross-sectional view of a semiconductor device 100, which represents a composite semiconductor device comprising the semiconductor die 150 and a complementary package substrate 160. In the manufacturing stage shown, the die 150 and the package substrate 160 may be mechanically coupled by any appropriate external equipment (not shown), thereby mechanically connecting the bumps or pillars 152 of the contact structure 151 with complementary solder bumps 162 of a contact structure 161 of the package substrate 160. The package substrate 160 may comprise any appropriate inter-connect structure 165 in order to connect the various bumps 162 to any further contact features (not shown) for connecting the composite semiconductor device 100 with the periphery, for instance by contact pins, and the like. To this end, appropriate conductive lines (not shown) may connect to the various solder bumps 162 via appropriately configured contact pads 163.

Similarly, the semiconductor die 150 may comprise a substrate 156 including one or more semiconductor layers, in and above which circuit elements are formed (not shown), such as transistors, resistors, capacitors and the like. Furthermore, a metallization system 155 comprising a plurality of metallization layers (not shown) is typically formed "above" the substrate 156 and includes metal features, such as metal lines and vias, in order to establish the electrical connections between the individual circuit elements. As discussed above, the metallization system 155 may comprise sensitive low-k dielectric materials or ULK materials, in combination with highly conductive metals, such as copper, thereby resulting in a stack of metallization layers which may have a reduced mechanical strength. Consequently, any mechanical forces that may be exerted to the contact structure 151 may also be transferred to any lower-lying metallization layers of the system 155, thereby possibly creating severe damage therein, when the mechanical stress exceeds a certain magnitude.

The semiconductor die 150 may be formed on the basis of any well-established process strategy, in which sophisticated circuit elements, such as transistors having a critical dimension of 50 nm and less, may be provided in combination with a complex metallization system including a plurality of sensitive stacked metallization layers, which may receive as a final layer the contact structure 151 comprising any appropriate dielectric material in combination with the solder bumps or metal pillars 152. Generally, due to the ongoing demand for avoiding critical materials in semiconductor processing, such as lead, solder materials have been developed, for instance on the basis of silver, tin, copper and the like, in an attempt to avoid the usage of lead, wherein, however, these solder materials may generally have different mechanical characteristics and may typically have a higher melting point compared to lead-based solder materials. For example, lead-free solder materials are typically stiffer compared to the relatively soft lead-containing solder materials. Consequently, upon applying mechanical forces to the contact structure 151, a lead-free solder material or any other bump material may transfer resulting mechanical forces more efficiently into the underlying metallization system 155. Similarly, frequently, copper pillars may be used, which may even have a further increased stiffness, which may thus result in an increased mechanical stress in the vicinity of the contact features 152.

After separating the individual semiconductor die 150, the processing is continued by attaching the package substrate 160 to the die 150 and applying heat and a certain mechanical force in order to establish an inter-metallic connection between the bumps 152 of the die 150 and the bumps 162 of the package substrate 160. To this end, the composite device 100 is heated above the melting temperature of the solder material, such as the solder bumps 162, wherein, as discussed above, generally an increased temperature may be required compared to well-established lead-containing solder materials.

FIG. 1e schematically illustrates the device 100 during a first process phase in forming the desired inter-metallic connection between the various structures of the die 150 and the substrate 160 (FIG. 1d). For this purpose, a heat treatment 110 may be performed, in which the device 100 is heated to a temperature T that is higher than a melting temperature $T_{melt}$ of the solder material, wherein, typically, the device 100 is brought into an equilibrium state, i.e., substantially the same temperature is obtained at any position within the device 100 in order to initiate the reflowing of the solder material for any solder bump in the device 100. To this end, the device 100 may be efficiently thermally coupled to a process ambient, as indicated by 110, in which the device 100 may be uniformly heated, for instance by adjusting an appropriate process temperature within a process chamber accommodating the device 100. For example, appropriate heat media, such as gases and the like, may be appropriately supplied to the device 100 in order to obtain a uniform temperature across the entire volume of the device 100. Consequently, in this heating step, thermal energy may flow from any external temperature reservoir to the device 100, as indicated by the arrows in FIG. 1e. After achieving the desired reflow temperature, the temperature may be held constant for a certain time interval so as to establish appropriate process conditions for reflowing the solder material and forming the inter-metallic connection for any of the solder bumps. The status of substantially constant temperature above the melting temperature of the solder bump is indicated in FIG. 1e by the hatched surface of the device 100.

FIG. 1f schematically illustrates a diagram, in which the temperature of the device 100 is illustrated in the vertical axis, while the process time is shown on the horizontal axis. Thus, the phase 110 may thus comprise an interval of a rising temperature so as to finally reach the desired process temperature T, which may then be held constant for a desired time so as to achieve an equilibrium temperature for any point of the device 100 and to reliably establish the inter-metallic connection upon reflowing the solder material. It should be appreciated that the local temperature in the device 100 may vary prior to reaching the equilibrium state, since, for instance, peripheral areas may heat up faster than central areas, depending on the interaction between the process ambient and the device 100 during the process phase 110. Subsequent to the phase 110, the device 100 may be cooled down (process phase 111), which may be accomplished by changing the process temperature of the temperature reservoir, for instance by providing a heat medium of reduced temperature, by simply deactivating any heating elements and the like.

FIG. 1g schematically illustrates the qualitative progression of the temperature during a cooling phase 111, wherein the speed of temperature change may be selected in accordance with throughput criteria and overall thermal stress, which may build up upon heating or cooling the device 100 with increased speed. It turns out, however, that well-established process strategies for heating and, in particular, cooling the device 100 may result in increased yield losses upon using lead-free solder materials, pillar structures in the semiconductor die in combination with sophisticated metallization systems based on low-k dielectric materials. Without intending to restrict the present application to the following explanation, it is assumed that an increased internal temperature gradient may cause significant failures in the metallization systems due to an increased mechanical stress applied to the contact elements at peripheral areas of the semiconductor die.

FIG. 1h schematically illustrates the device 100 during the cooling phase 111, wherein the device 100 transfers heat energy to the process ambient, as indicated by the arrows in FIG. 1h. Since the peripheral area 100P of the device 100 may be coupled more intensively to the process ambient, for instance due to the overall increased surface area for a given volume compared to a central area 100C, the temperature at the peripheral area 100P, indicated as $T_P$, may change faster and may thus be less than the temperature $T_C$ of the central area 100C. Consequently, the solder material in the peripheral area 100P may solidify earlier and may thus establish a strong mechanical connection between the semiconductor die and the package substrate, wherein, generally, the difference in the coefficient of thermal expansion between the substrate and the semiconductor die may additionally contribute to a corresponding mechanical stress, which may thus be transferred into the sensitive metallization system of the semiconductor die in the peripheral area 100P.

FIG. 1i schematically illustrates the device 100 in a further advanced phase of the cooling process 111, wherein the average temperature of the device 100 may be less compared to the average temperature as shown in FIG. 1h, while at the same time significant temperature gradient, indicated as $T_G$, may have built up between the central region 100C and the peripheral region 100P, thereby even further increasing the mechanical stress, in particular in the central region 100P, in which the solder bumps may have been solidified for a longer time interval compared to any inner areas of the device 100.

FIG. 1j schematically illustrates a cross-sectional view of the device 100 in an advanced stage of the cooling phase 111 (FIG. 1i), wherein an inter-metallic connection between the contact features 152 and the bumps 162 is achieved, at least in the peripheral area 100P, wherein the significant temperature gradient $T_G$ may thus result in significant stress components 155C, 155T in the form of compressive and tensile stress in the vicinity of the contact features 152, since these features are generally less resilient compared to lead-containing solder bumps, as discussed above. Consequently, the significant stress components 155T, 155C may result in significant damage in the metallization system 155, for instance by inducing cracks and delamination 155S, in particular in sensitive low-k dielectric materials.

In some conventional approaches, the metallization system 155 is provided with superior mechanical characteristics, for instance by using harder and stiffer dielectric materials, which, in turn, may result in an increased permittivity and thus higher parasitic capacitance values, which may therefore lead to a significantly reduced electrical performance of the metallization system 155. Furthermore, using lead-containing solder materials may not be a viable solution in view of environmental aspects. Furthermore, a significant reduction of the temperature change during the cooling phase may result in a significant reduction of the overall process throughput, which may be less than desirable in volume production strategies.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing strategies and systems in which a reflow process for forming a composite semiconductor device on the basis of a semiconductor die and a package substrate may be performed in such a way that a reduced temperature gradient is achieved during the cooling phase, however, without unduly affecting the overall process time. To this end, an appropriate process control during the cooling phase may be established so as to provide superior temperature equalization between the periphery and the center of the composite semiconductor device by additionally coupling the composite semiconductor device to a temperature reservoir, which, in some illustrative embodiments disclosed herein, may couple globally to the composite semiconductor device on the basis of short time intervals, which may not significantly affect the overall process time, which, however, may sufficiently reduce the difference in the actual temperature between the central and the peripheral areas. In other illustrative embodiments, a temperature reservoir may be efficiently coupled to a locally restricted area within the composite semiconductor device, thereby providing the possibility of efficiently reducing the internal temperature difference without increasing the overall process time or even reducing the total process time. Consequently, due to the active temperature control during the cooling phase of the reflow process, sophisticated metallization systems on the basis of low-k dielectric materials and lead-free solder materials may be used, substantially without affecting the overall process time and thus throughput, while at the same time avoiding additional yield losses caused by mechanical stress in the sensitive metallization system.

One illustrative method disclosed herein relates to assembling a semiconductor die in a package substrate. The method comprises heating a composite device comprising the semiconductor die and the package substrate above a melting temperature of a solder material that is formed between a contact structure of the package substrate and a contact structure of the semiconductor die. The method further comprises applying a first cool down interval so as to initiate solidification of the solder material. Additionally, the method comprises applying at least one intermediate heating step after applying the first cool down interval. Moreover, the method comprises applying a second cool down interval after the at least one intermediate heating step.

A further illustrative method disclosed herein comprises reflowing a solder material formed between a contact structure of a semiconductor die and a contact structure of a package substrate so as to form a composite semiconductor device. The method further comprises allowing the reflowed solder material to solidify by cooling down the composite semiconductor device to ambient temperature. The method further comprises actively controlling the cooling down so as to reduce a temperature difference between a center of the composite semiconductor device and a periphery thereof.

One illustrative reflow system disclosed herein is configured for connecting a semiconductor die to a package substrate. The reflow system comprises a substrate holder configured to receive the semiconductor die and the package substrate. Furthermore, the reflow system comprises a processing area configured to establish a heating zone for heating a solder material formed between the semiconductor die and the package substrate to a temperature above a melting point of the solder material so as to form a composite semiconductor device. The processing area is further configured to establish a cooling zone for solidifying the solder material, wherein the cooling zone comprises a controllable temperature reservoir that is configured to reduce a temperature difference between a center of the composite semiconductor device and a periphery thereof.

BRIEF DESCRIPTION OF THE DRAWINGS

The disclosure may be understood by reference to the following description taken in conjunction with the accompanying drawings, in which like reference numerals identify like elements, and in which:

FIGS. 1a-1c schematically illustrate top views of a semiconductor die and a corresponding bump structure of a complex semiconductor device;

FIG. 1d schematically illustrates a cross-sectional view of a composite semiconductor device comprising a semiconductor die and a package substrate in a phase prior to reflowing a solder material;

FIG. 1e schematically illustrates the composite semiconductor device during a heating phase of a conventional reflow process;

FIG. 1f schematically illustrates a temperature diagram of the reflow process including a cooling phase performed on the basis of conventional strategies;

FIGS. 1g-1i schematically illustrate top views of the composite semiconductor device during the cooling phase according to conventional strategies;

FIG. 2h schematically illustrates temperature diagrams of a central region and a peripheral region, respectively, according to further illustrative embodiments, in which a locally restricted coupling to a temperature reservoir may be accomplished during the cooling phase;

FIGS. 2i-2j schematically illustrate top views of the composite semiconductor device, wherein a central region may be coupled to a temperature reservoir for superior cooling effect of the central region;

FIG. 2k schematically illustrates a cross-sectional view of the composite semiconductor device when being in contact with its central portion with a temperature reservoir, such as a jet of heat medium, radiation and the like;

Figure 1H:
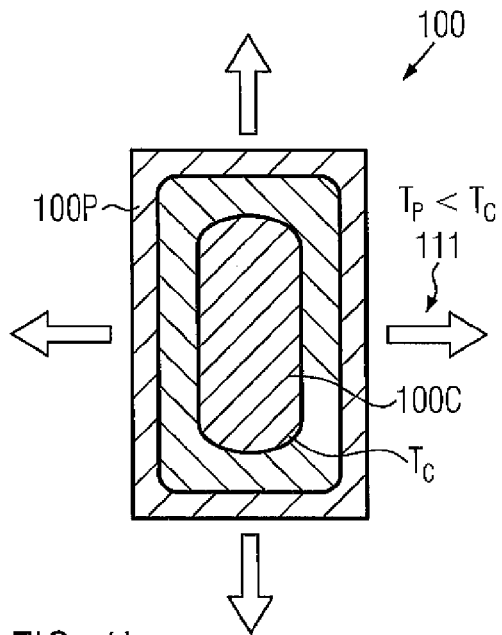
Figure 1I:
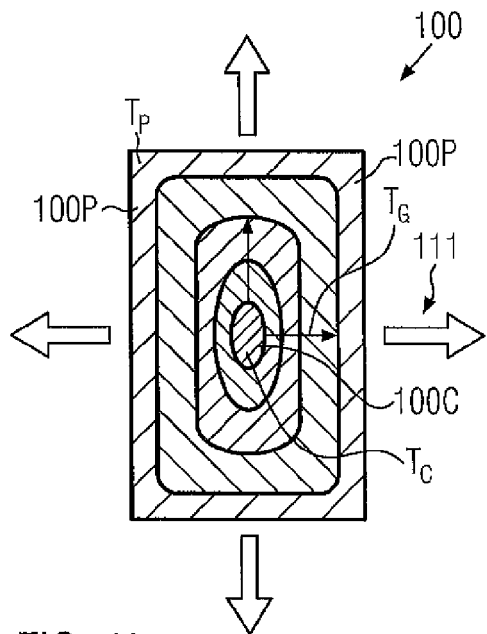
Figure 1J:
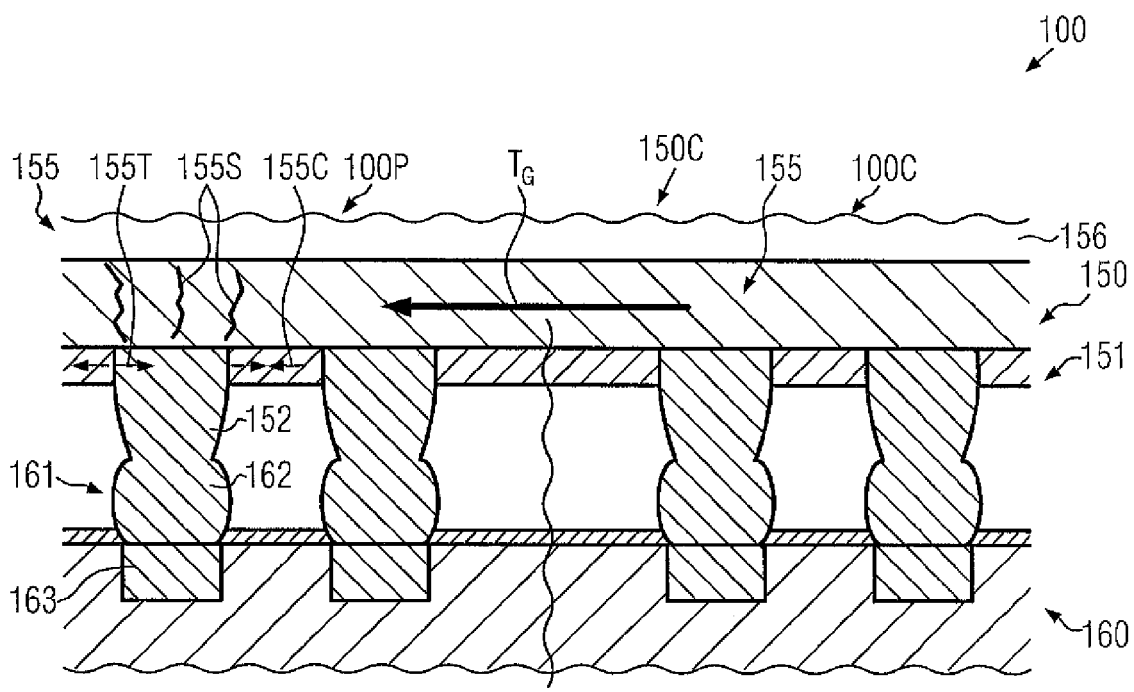
FIG. 1j schematically illustrates a cross-sectional view of the composite semiconductor device, wherein significant mechanical stress may result in damage in the sensitive metallization system of the semiconductor die.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing strategies and reflow systems in which sophisticated semiconductor dies and package substrates may be connected with high process throughput, while avoiding undue damage of sensitive metallization systems, which may be formed on the basis of low-k dielectric materials in combination with lead-free bump or pillar structures. To this end, the cooling phase of the reflow process may be controlled such that a reduced temperature difference is achieved between peripheral areas and central areas of the composite semiconductor device, which may have a different heat dissipation behavior, since the peripheral area may interact more efficiently with a process ambient due to the increased ratio between surface and volume in the periphery compared to the center of the composite semiconductor device. A reduction in the temperature difference and thus the final temperature gradient upon solidifying the reflowed solder material may be accomplished by locally slowing down the cooling of the peripheral area, however, without significantly affecting the overall process time. To this end, in some illustrative embodiments, a global interaction of the composite semiconductor device with a temperature reservoir, such as a radiation source, a heat transfer medium and the like, may be established for a short time period, wherein, due to the superior interaction of the periphery with the temperature reservoir, an increased effect may be achieved in the periphery, which may result in a local temperature rise or in a reduced drop of temperature, thereby obtaining a certain approximation of the peripheral temperature with respect to the central temperature. On the other hand, the additional short heating step during the cooling phase may be applied for a very short time interval compared to the total length of the cooling phase, thereby substantially not contributing to an overall increased process time. For example, in certain embodiments, the amount of process time that is used to perform the short heating step may be substantially less than the amount of process time that is used to perform an initial cool down interval before the short heating step is performed, and furthermore, it may also be substantially shorter than the amount of process time that is used to perform a subsequent cool down interval after the short heating step has been performed. In some illustrative embodiments, the change in temperature during the following cooling interval may even be increased, since the reduced temperature difference between the various positions within the composite semiconductor device may allow a certain acceleration of the cooling phase, thereby achieving substantially the same overall process time or even a reduced process time compared to conventional strategies. In still other illustrative embodiments, one or more further short heating steps may be introduced so as to reduce or compensate for any further differences in temperature, which may have been generated during the further advance of the cooling phase.

In other illustrative embodiments, the cooling phase may be actively controlled by coupling the temperature reservoir in a locally restricted manner to the composite semiconductor device, for instance by directing a jet of heat transfer medium to the central portion of the composite semiconductor device, wherein the heat transfer medium may have a temperature that is less than the current temperature of the central area. In this manner, the cooling effect may be enhanced locally in the center area, thereby also contributing to a reduced difference in temperatures between the periphery and the center of the composite semiconductor device. In other cases, the temperature reservoir may be established on the basis of a direct mechanical contact with the semiconductor device, wherein an appropriate temperature distribution may be provided, for instance by using controllable heating elements so that a desired reduced temperature may be applied to the central portion of the composite semiconductor device.

With reference to FIGS. 2a-2p and 3a-3c, further illustrative embodiments will now be described in more detail, wherein reference may also be made to FIGS. 1a-1j, if required, for instance when referring to a specific configuration of semiconductor dies, package substrates and composite semiconductor devices.

Figure 2A:
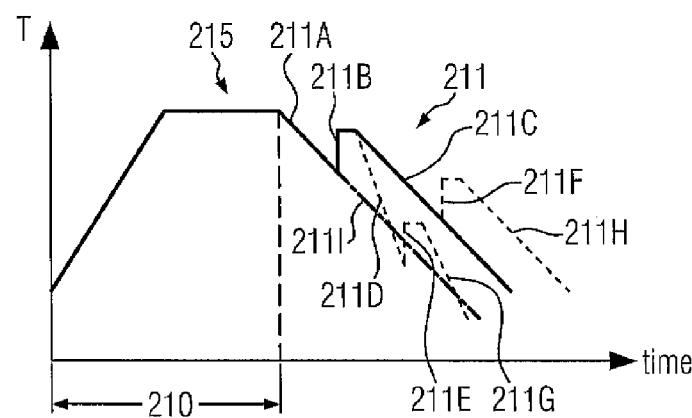
FIG. 2a schematically illustrates a temperature diagram of a reflow process for connecting a semiconductor die and a package substrate with a superior cooling phase for improved equalization of temperatures between peripheral and central device areas, according to illustrative embodiments.

FIG. 2a schematically illustrates a temperature profile, as may be used for performing a reflow process for attaching a package substrate to a semiconductor die by using appropriate contact structures including a solder material. In FIG. 2a, the horizontal axis represents the process time, while the vertical axis illustrates the process temperature T, which is to be understood as the temperature provided by any appropriate temperature reservoir that globally interacts with a composite semiconductor device. In this respect, a global interaction is to be understood as a process state in which a substantially constant energy density may be applied to the surface of the composite semiconductor device. It should be appreciated, however, that the process temperature provided by the temperature reservoir in a global manner may result in a locally varying temperature within the composite semiconductor device due to the different surface-to-volume ratio, for instance at the periphery relative to the central area of the composite semiconductor device.

As illustrated, the reflow process, generally indicated as 215, may comprise a heating phase 210, which is to be understood as a phase in which the process temperature rises or is kept constant so as to finally accomplish a reflowing of the solder material in each of the solder bumps of the composite semiconductor device. In the embodiment shown, a substantially linear temperature rise and a substantially constant temperature phase for obtaining the equilibrium and uniformly reflowing the solder material may be used. It should be appreciated, however, that any other regime for reflowing the solder material may be applied. Furthermore, the process 215 generally comprises a cooling phase 211 having a first cooling interval 211A, in which the process temperature may drop to a certain temperature at which a significant solidification and temperature gradient between a central area and a peripheral area of the composite semiconductor device may not occur. Next, a first intermediate heating step 211B may be introduced with a moderately short duration of one to several seconds, wherein the process temperature may significantly rise, wherein, however, as explained above, the actual temperature in the composite semiconductor device may not necessarily rise, wherein, however, any local differences may be reduced. Thereafter, in some illustrative embodiments, a further cooling interval 211 C may be applied with any desired drop in the process temperature. Furthermore, in certain embodiments, the process time used to perform the first intermediate heating step 211B may be substantially less than the process times used to perform either of the first cooling interval 211A and the further cooling interval 211C, as described above. In other cases, a cool interval 211D with an increased change in process temperature may be applied, followed by a further intermediate heating step 211E after which a further cooling interval 211G may be applied. As illustrated, since the temperature changes of the intervals 211D, 211G may be selected to be faster, due to the superior temperature distribution in the composite semiconductor device, in total, a reduced process time may be accomplished. Additionally, as with the first intermediate heating step 211B, the process time of the further intermediate heating step 211E may be substantially less than the process times cool interval 211D and the further cooling interval 211G, as previously noted. In other cases, as illustrated by the intermediate heating step 211F and the subsequent cooling interval 211H, a slightly increased process time may be realized for the benefit of generally superior temperature conditions in the composite semiconductor device. Moreover, as with the first intermediate heating steps 211B and 211E above, it should be understood that the process time of the intermediate heating step 211F may similarly be substantially less than the process times of either the further cooling interval 211C or the subsequent cooling interval 211H.

It should be appreciated that appropriate speeds for a temperature change during the cooling phase 211, i.e., appropriate values for the slope of the progression of the temperature in FIG. 2a, may be determined on the basis of experiments and the like, wherein, generally, well-established process recipes may be used as a start value. For example, a curve 211I may represent a conventional cool down phase and thus a conventional process time for a given configuration of a reflow system and a composite semiconductor device.

Figures 2B, 2C:
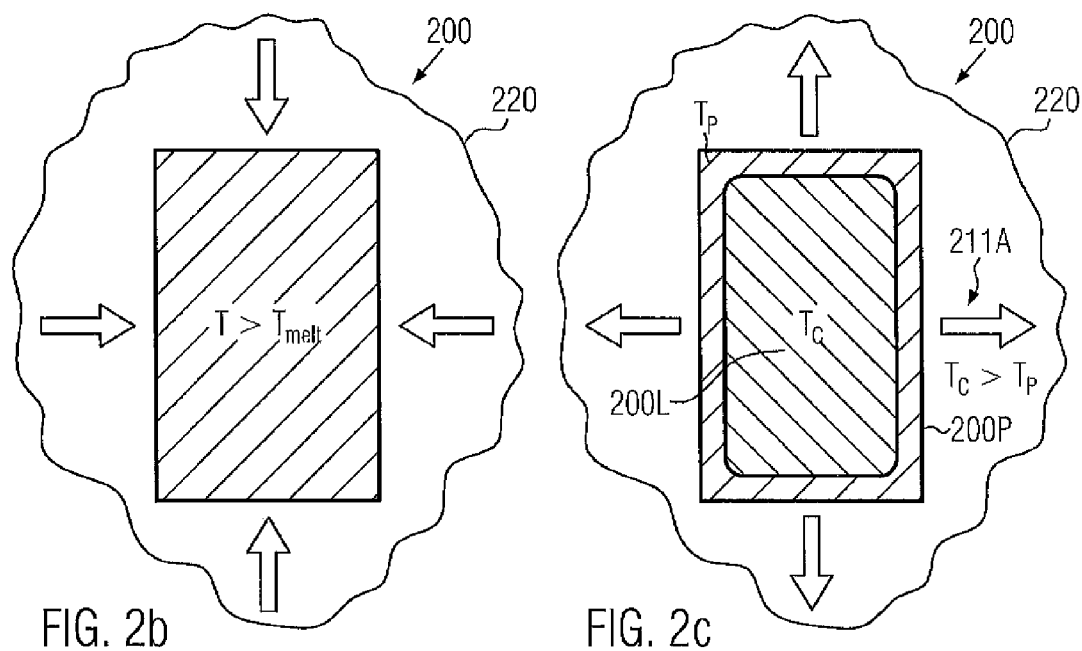
FIGS. 2b-2d schematically illustrate top views of the composite semiconductor device during a reflow phase and an initial cooling phase, according to illustrative embodiments.

FIG. 2b schematically illustrates a top view of a composite semiconductor device 200, which may have any appropriate configuration and which may comprise a semiconductor die and a package substrate that are in mechanical contact via appropriate bump structures. The composite semiconductor device 200 may have basically the same configuration as shown in FIGS. 1a-1d when referring to the semiconductor die 150, the package substrate 160 and the composite semiconductor device 100. Thus, a detailed description of any of these components is omitted here. The composite semiconductor device 200 may be thermally coupled in a global manner, i.e., in the above-defined sense, to a temperature reservoir 220, thereby raising the temperature of the composite semiconductor device 200, for instance as qualitatively shown in FIG. 2a. The temperature reservoir 220 may, for instance, have a desired temperature that is above the melting temperature of the solder material, such a lead-free solder material, as previously discussed with reference to the device 100. The temperature of the reservoir 220 may be held constant at the desired target temperature, thereby avoiding any undue temperatures in the device 200, for instance at the periphery thereof. It should be appreciated, however, that, during the phase of raising the temperature of the device 200, even a significantly high temperature may be applied so as to adjust the slope of the temperature change in accordance with the overall process requirements. It should be appreciated that any temperature gradient, which may develop upon arising the temperature of the device 200, may be less critical, since the bump structures of the semiconductor die and the package substrate are yet merely mechanically coupled to each other but may not yet have formed an inter-metallic connection, as is, for instance, illustrated in FIG. 1d for the composite device 100. On the other hand, when reaching the melting temperature at peripheral positions within the semiconductor device 200, the solder bumps may melt and may be kept in the molten state, as long as the device 200 has reached its equilibrium state, in which all solder bumps are reflown and are thus in a very resilient state.

FIG. 2c schematically illustrates the composite semiconductor device 200 at an initial state of the cooling phase 211 as illustrated in FIG. 2a. For example, the temperature reservoir 220 may have any appropriate temperature below the melting point of the solder material so as to initiate heat transfer from the device 200 to the temperature reservoir 220 during the cooling interval 211A. As previously discussed, the temperature $T_P$ in a peripheral region 200P may be less than a temperature $T_C$ in a central region 200C, since peripheral region 200P may be coupled to the reservoir 220 via an increased surface area compared to the central region 200C.

Figures 2D, 2E:
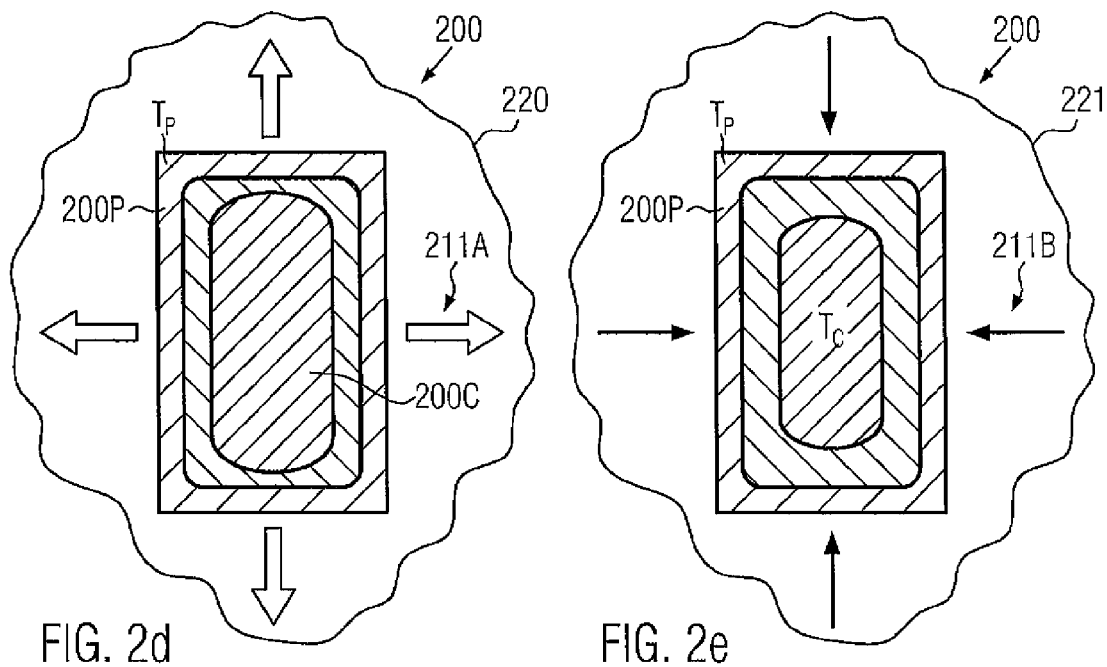
FIG. 2e schematically illustrates the composite semiconductor device during a short heating step so as to provide reduced temperature difference between the peripheral and the central areas.

FIG. 2d schematically illustrates the device 200 in a further advanced stage of the cooling interval 211A, wherein a more pronounced difference in temperature between the central region 200C and the peripheral region 200P may exist due to the thermal coupling to the temperature reservoir 220. For example, in the phase as shown in FIG. 2d, the solder material in the peripheral region 200P may start to solidify and thus the resilience may be increasingly reduced in the peripheral region 200P.

FIG. 2e schematically illustrates the composite device 200 when coupled to a temperature reservoir 221, which may have a higher temperature when compared to the current temperature $T_P$ of the peripheral portion 200P. The temperature reservoir 221 may be provided in the form of any appropriate heating element, such as a radiation source in the form of a lamp, a laser, a source for transferring a heat transfer medium to the device 200, for instance in the form of gases, vapors, and the like. Consequently, energy is temporarily transferred from the heat reservoir 221 to the device 200, thereby preferably raising the temperature $T_P$ in the peripheral region 200P or at least reducing the change of temperature drop in the region 200P, depending on the actual temperature of the reservoir 221 and the time interval of interaction with the device 200. It should be appreciated that the rise in temperature during the intermediate heating step 211B as shown in FIG. 2a may correspond to a change in the process temperatures and may thus correspond to a difference of the temperatures of the reservoirs 220 as shown in FIG. 2d and the temperature reservoir 221 in FIG. 2e, wherein the effective temperature $T_P$ in the device 200 may depend on the process temperature and the time of interaction with the device 200. For example, the intermediate heating step 211B may be performed for a time interval of approximately 0.1 to several seconds and may thus be significantly less compared to the length of the total cooling phase 211, as shown in FIG. 2a. For example, the process temperature of the reservoir 221 may be selected to be approximately 200-400° C., for instance when using a heat transfer medium. In other cases, corresponding radiation sources may have a higher temperature and may be efficiently coupled via radiation with the composite device 200, wherein the length of the radiation pulse may be approximately selected so as to obtain the desired thermal response of the device 200 in order to reduce the temperature difference between the central region 200C and the peripheral region 200P.

Figures 2F, 2G:
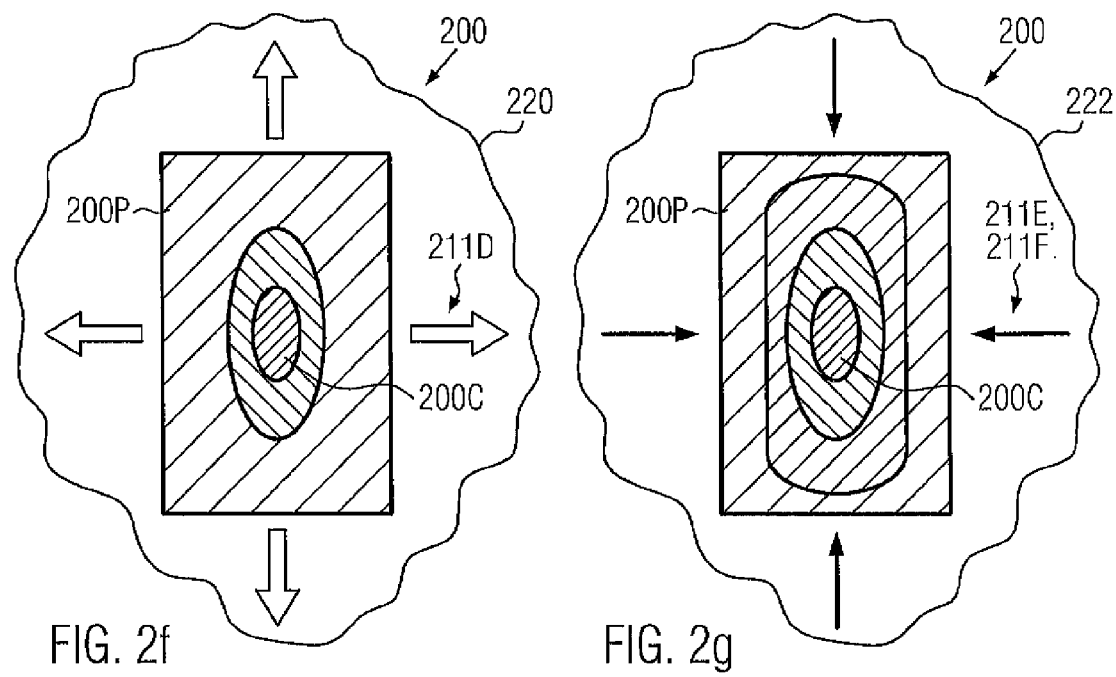
FIGS. 2f-2g schematically illustrate the composite semiconductor device during further advanced process times with an additional optional heating step for even further reducing the overall difference in temperatures, according to illustrative embodiments.

FIG. 2f schematically illustrates the device 200 in a further advanced stage of the cooling phase 211 as shown in FIG. 2a. For example, the cooling interval 211D may be applied and may result in a further drop of the average temperature of the device 200 due to the interaction with the temperature reservoir 220, wherein, however, the difference between the central region 200C and the peripheral region 200P may still be reduced compared to conventional process regimes, depending on the effect of the preceding intermediate heating step 211B as shown in FIG. 2e. It should be appreciated that, if desired, temperature in the peripheral portion 200P may be adjusted to be higher as the current temperature in the central region 200C so that, during the further cooling down of the device 200, generally, a reduced temperature difference may be maintained when the peripheral region 200P again starts to cool down more rapidly compared to the central region 200C.

FIG. 2g schematically illustrates the device 200 according to further illustrative embodiments, in which an additional intermediate heating step, such as the steps 211E, 211F (FIG. 2a), may be applied on the basis of an appropriate temperature reservoir 222 having a desired process temperature in order to further reduce the temperature difference between the central portion and the peripheral portion so as to achieve a cooling down phase, in which generally the temperature distribution within the composite semiconductor device 200 is superior compared to a conventional process strategy. As discussed above, even a temperature gradient may be adjusted, which is direct from the peripheral region 200P to the central region 200C, if desired. It should be noted that also in the one or more additional heating steps 211E, 211F, the process temperature of the reservoir 222 and the duration of the heating may be appropriately selected so as to obtain the desired heat distribution in the device 200. For example, the process temperature of the reservoir 222 may be selected from approximately 80-400° C. or even higher with a process time of 0.1-10 seconds. Thereafter, the cooling down may be continued on the basis of a reduced process temperature using the temperature reservoir 220, as previously explained, so as to finally obtain a non-critical temperature of approximately 50° C. and less. Consequently, in a final stage, the composite device 200 may reach an equilibrium state and may thus have the ambient temperature, for instance of approximately 20-25° C., depending on the clean room conditions in the manufacturing environment.

With reference to FIG. 2h, the temperature of the composite semiconductor device may be qualitatively illustrated according to other illustrative embodiments, in which the semiconductor device may interact with a temperature reservoir in a locally restricted manner, i.e., the thermal coupling to the temperature reservoir may be non-uniform and may thus reduce or compensate for a generally non-constant temperature distribution within the composite device during the cooling down phase. In the embodiment shown, the cooling of the central region may be accelerated by locally providing a heat transfer medium at the central region or by directly contacting the central region with the substrate holder acting as a temperature reservoir having an appropriate temperature distribution.

FIG. 2h schematically illustrates the qualitative progression of the temperature of the central region, as indicated by curve A, which may rise at a reduced slope during the phase 210, as previously discussed. On the other hand, the temperature of the peripheral region, as indicated by curve B, may raise faster, thereby achieving the desired process temperature for reflowing the solder material earlier compared to curve A. As previously discussed, typically, a time interval of constant process temperatures may be maintained so as to obtain an equilibrium state and thus reliably reflow any solder material in the composite semiconductor device. Thereafter, the cooling phase 211 is initiated by appropriately coupling a temperature reservoir, as discussed above, wherein at any appropriate stage of the phase 211, for instance at the beginning or at any intermediate stage, the center of the composite semiconductor device may be locally cooled down, for instance by providing a heat transfer medium locally in the center region, thereby achieving a desired approximation of the cool down times of the center portion and the peripheral portion, wherein the magnitude of the temperature difference may be efficiently controlled on the basis of controlling the local temperature reservoir.

FIG. 2i schematically illustrates a top view of the device 200 when coupled to the temperature reservoir 220 during the phase 210 so as to achieve the desired equilibrium state.

FIG. 2j schematically illustrates the device 200 during any appropriate stage of the cooling phase 211, wherein the temperature reservoir 220 may have any appropriate temperature so as to initiate a cooling down of the device 200, in combination with a temperature reservoir 223 providing a locally restricted thermal coupling to the device 200. It should be appreciated that a locally restricted thermal interaction is to be understood such that the interaction and thus the thermal effect is different across the device 200 so that an increased cooling effect may be obtained in the center region compared to the peripheral region of the device 200. For example, the temperature reservoir 220 may be represented by the ambient atmosphere, while the locally restrictively acting temperature reservoir 223 may be represented by the heat transfer medium, such as gas, liquid, vapor, a direct mechanical contact and the like, wherein also a thermal effect may be achieved in the periphery of the device 200, however, at a significantly reduced amount.

Figure 2K:
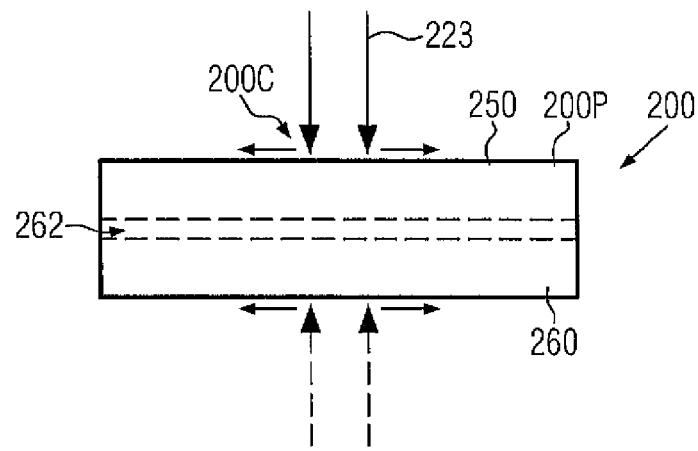

FIG. 2k schematically illustrates a cross-sectional view of the composite semiconductor device 200 comprising a semiconductor die 250 and a package substrate 260, which may have a similar configuration as previously described with reference to the device 100. Moreover, solidified or solidifying solder material 262 may be provided between the components 250, 260, as is also previously discussed. Moreover, the temperature reservoir 223 is schematically illustrated and may be represented by a jet of any appropriate heat transfer medium, such as a gas, vapor and the like, with an appropriate temperature that is less than a current temperature in the central region 200C. It should be appreciated that the temperature reservoir 223 may also interact with the peripheral region 200P, wherein, however, due to the local application of the heat transfer medium or a direct mechanical contact, a reduction of the temperature difference between the central region 200C and the peripheral region 200P may be achieved. For example, a gas of appropriate temperature and provided with a selected gas flow rate may be directed to the central region 200C and may thus initiate an efficient heat transfer, thereby changing, i.e., lowering, the temperature of the central region and changing, i.e., raising, the temperature of the heat transfer medium, which may thus flow to the peripheral region 200P, thereby achieving a reduced cooling effect in the peripheral region 200P, which may finally result in a certain degree of equalization between the temperatures in the central region 200C and the peripheral region 200P. It should be appreciated that the temperature reservoir 223 may be coupled to the central region 200C on any side of the device 200 that is available and compatible with supporting the device 200 in any appropriate reflow system.

Figures 2L, 2M:
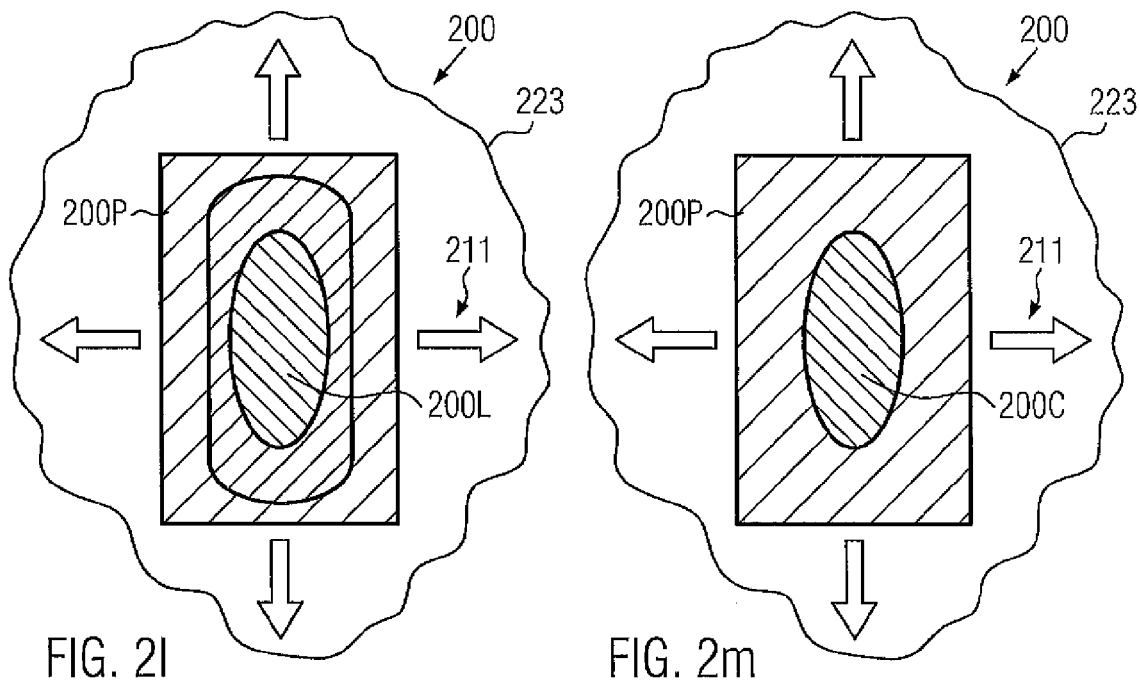
FIGS. 2l-2o schematically illustrate top views of the composite semiconductor device during advanced stages of the cooling phase, according to illustrative embodiments.
Figures 2N, 2O:
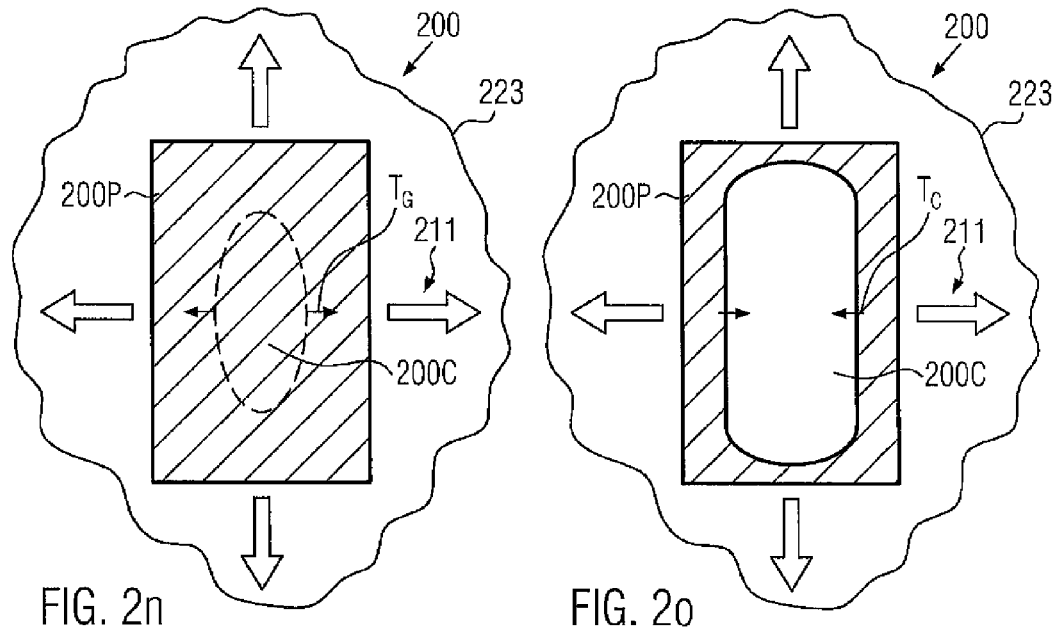

FIGS. 2l-2n schematically illustrate the device 200 during the further advance of the cooling phase 211, wherein, generally, the average temperature of the device 200 may drop, while at the same time the difference between the central region 200C and the peripheral region 200P may be maintained within a desired range, for instance by activating the temperature reservoir 223 once or several times or by permanently activating the temperature reservoir 223. It should be appreciated that the temperature reservoir 223 may be controlled, for instance, by controlling the actual temperature and/or by controlling the flow rate, as discussed above, so as to adapt the "equalizing" effect of the temperature reservoir 223 to the current state of the device 200. FIG. 2n illustrates the device 200 in a final stage of the cooling phase 211, wherein a reduced temperature gradient $T_G$ may be obtained so as to point from the central region 200C to the peripheral region 200P.

FIG. 2o schematically illustrates the device 200 according to other illustrative embodiments, in which the temperature gradient $T_C$ may be reversed, for instance by controlling the temperature reservoir 223 such that the central region 200C may have a lower temperature compared to the peripheral region 200P in this stage of the cooling phase 211.

Consequently, upon solidifying the solder bump material, generally, the temperature difference between the central region and the peripheral region of the device 200 may be reduced during the entire cooling phase on the basis of the above-identified mechanisms, thereby also reducing the mechanical stress in the sensitive metallization system of the device 200 so that sophisticated material systems, such as low-k materials, ULK materials and the like, may be used in combination with lead-free solder regimes. On the other hand, a desired short overall process time for reflowing and solidifying bump material may be achieved.

Figure 3A:
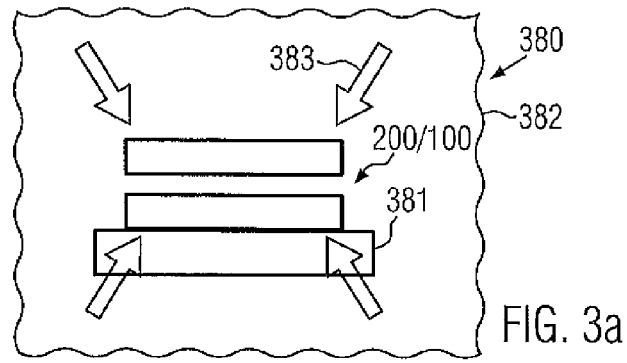
FIGS. 3a-3c schematically illustrate a reflow system comprising a processing zone for establishing heating and cooling zones with superior temperature equalization during the cooling phase, according to illustrative embodiments.
Figures 3B, 3C:
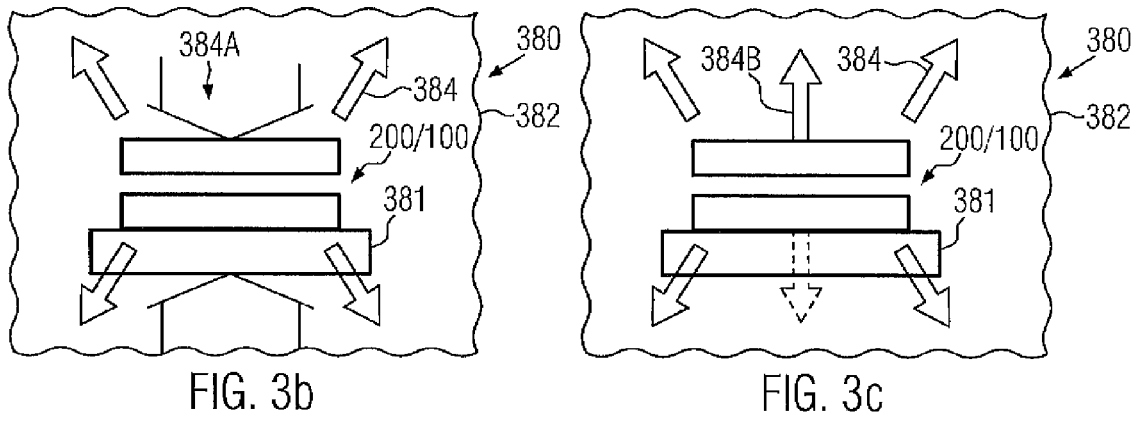

With reference to FIGS. 3a-3c, a reflow system will be described which is configured to perform the above-described reflow process strategies.

FIG. 3a schematically illustrates a reflow system 380 comprising a processing zone 382, which may be provided in the form of a process chamber and the like, which may be configured to establish one or more heating zones 383. A heating zone may be understood as an appropriate process ambient so as to couple a composite semiconductor device, such as the device 200 or the device 100, with a temperature reservoir in order to initiate the rising of temperatures of the device 200, 100 and obtaining a desired equilibrium state for reflowing the solder material in the device 200, 100. Moreover, the system 380 may comprise a substrate holder 381 that is configured to receive the device 200, 100 and allow an efficient thermal contact within the heating zone 383. The substrate holder 381 may have any appropriate configuration and may itself act as a temperature reservoir, if required. It should be appreciated that the processing zone 382 may be configured to provide one or more heating zones 383 without moving the substrate holder 381, while, in other cases, one or more heating zones may be provided which may be passed by the substrate holder 381 sequentially, wherein each of the heating zones 383 may have an appropriate process temperature.

FIG. 3b schematically illustrates the system 380, wherein the processing zone 382 may have provided therein a cooling zone 384 so as to initiate a drop in temperature of the device 200, 100, wherein, in the embodiment shown, additional mechanisms 384A, such as additional temperature reservoirs in the form of lamps, lasers, gas flow sources and the like, may be provided so as apply one or more spike heating steps or intermediate steps, as previously discussed with reference to FIG. 2a. It should be appreciated that the cooling zone 384 may also be provided in the form of two or more heating zones, which may be sequentially passed by the substrate holder 381, while, in other cases, a single process ambient may be used for providing the cooling zone 384 including the spike heating mechanism 384A.

FIG. 3c schematically illustrates the system 380 according to embodiments in which the cooling zone 384 may comprise a locally restricted cooling mechanism 384B, for instance in the form of a gas flow source, a heat distribution system provided in the substrate holder 381 and the like, in order to preferably couple a central region of the device 200, 100 with an appropriate temperature reservoir, as, for instance, discussed above with reference to FIG. 2h.

It should be appreciated that any hardware component of the system 380, such as gas flow sources to provide a gas flow of controlled flow rate and temperature, heating elements provided in the substrate holder 381 so as to provide a locally varying temperature and the like, are well known in the art and may be used in the system 380.

As a result, the present disclosure provides manufacturing strategies and reflow systems in which semiconductor dies comprising sensitive metallization systems formed on the basis of low-k dielectric materials, ULK materials and the like may be connected to a package substrate on the basis of a lead-free contact regime by reducing the temperature gradient or temperature difference between a central region and a peripheral region of the composite semiconductor device without unduly increasing overall process time. In other cases, the effective process time may even be reduced by, for instance, providing a locally restricted cooling effect for the central region of the composite semiconductor device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of assembling a composite semiconductor device comprising a semiconductor die, a package substrate, and a solder material positioned between a contact structure of said package substrate and a contact structure of said semiconductor die, the method comprising:

exposing said composite device to a device heating process in a processing environment at a process temperature so as to melt said solder material, wherein said process temperature is adjusted to a first temperature level that is greater than a melting temperature of said solder material; and exposing said composite device to a device cooling process in said processing environment so as to solidify said melted solder material, said device cooling process comprising:

performing a first cooling step that comprises decreasing said process temperature in said processing environment from said first temperature level to a second temperature level that is less than said melting temperature of said solder material;

after performing said first cooling step, performing at least a first heating step substantially without holding said process temperature in said processing environment at said second temperature level, said at least said first heating step comprising increasing said process temperature in said processing environment from said second temperature level to a third temperature level; and after performing said at least said first heating step, performing a second cooling step that comprises decreasing said process temperature in said processing environment from said third temperature level to a fourth temperature level that is less than said second temperature level.

2. The method of claim 1, wherein said solder material is a lead-free solder material.

3. The method of claim 1, wherein said third temperature level is less than said melting temperature of said solder material.

4. The method of claim 1, wherein said semiconductor die comprises a metallization system that comprises a low-k dielectric material.

5. The method of claim 1, wherein said fourth temperature level is in the range of approximately 20-50° C.

6. The method of claim 1, further comprising:
after performing said second cooling step, performing at least a second heating step substantially without holding said process temperature in said processing environment at said fourth temperature level, said at least said second heating step comprising increasing said process temperature in said processing environment from said fourth temperature level to a fifth temperature level; and
after performing said at least said second heating step, performing a third cooling step that comprises decreasing said process temperature in said processing environment from said fifth temperature level to a sixth temperature level that is less than said fourth temperature level.

7. The method of claim 1, wherein performing at least one of said first and second cooling steps comprises substantially continuously decreasing said process temperature in said processing environment to a respective one of said second and fourth temperature levels.

8. The method of claim 1, wherein a process time of said at least said first heating step is less than each of said first and second cooling steps.

9. A method, comprising:
forming a composite semiconductor device comprising a semiconductor die and a package substrate by reflowing a solder material formed between a contact structure of said semiconductor die and a contact structure of said package substrate during a device heating phase;
solidifying said reflowed solder material by cooling said composite semiconductor device down to substantially ambient temperature during a device cooling phase; and
reducing a temperature difference between a center of said composite semiconductor device and a periphery of said composite semiconductor device during said device cooling phase by controlling a process temperature to which said composite semiconductor device is exposed, wherein controlling said process temperature comprises:
thermally coupling said composite semiconductor device with a temperature reservoir;
performing a first temperature control step by operating said temperature reservoir to decrease said process temperature to a first intermediate temperature level that is below a melting temperature of said solder material;
after performing said first temperature control step, and substantially without maintaining said process temperature at said first intermediate temperature level, performing a second temperature control step by operating said temperature reservoir to increase said process temperature from said first intermediate temperature level to a second intermediate temperature level that is below said melting temperature of said solder material; and
after performing said second temperature control step, performing a third temperature control step by operating said temperature reservoir to decrease said process temperature from said second intermediate temperature level to substantially ambient temperature.

10. The method of claim 9, wherein controlling said process temperature further comprises thermally coupling said composite semiconductor device to a second temperature reservoir that provides a locally varying temperature across said composite semiconductor device.

11. The method of claim 9, wherein controlling said process temperature further comprises directing a jet of a heat transfer medium to a locally restricted area of said composite semiconductor device.

12. The method of claim 11, wherein directing a jet of heat transfer medium comprises directing said jet to a center area of said composite semiconductor device, wherein said jet of said heat transfer medium has a lower temperature than a current temperature of said center area.

13. The method of claim 9, wherein controlling said process temperature further comprises temporarily coupling at least a peripheral area of said composite semiconductor device with a second temperature reservoir having a temperature that is higher than a current temperature of said peripheral area.

14. The method of claim 13, wherein temporarily coupling at least said peripheral area with said second temperature reservoir comprises directing at least one of a jet of heat transfer medium and a radiation beam locally to said peripheral area.

15. The method of claim 13, wherein temporarily coupling at least said peripheral area with said second temperature reservoir comprises directly contacting said peripheral area with a heating element.

16. The method of claim 13, wherein temporarily coupling at least said peripheral area with said second temperature reservoir comprises coupling said composite semiconductor device as a whole with said temperature reservoir.

17. The method of claim 13, wherein temporarily coupling at least said peripheral area with said second temperature reservoir comprises coupling said composite semiconductor device with said temperature reservoir for a time interval of 10 seconds or less.

18. The method of claim 9, wherein said solder material is a lead-free solder material.

19. The method of claim 18, wherein said semiconductor die comprises a metallization system formed on the basis of copper and a low-k dielectric material.

20. A method of claim 9, wherein performing said third temperature control step comprises:
performing a fourth temperature control step by operating said temperature reservoir to decrease said process temperature from said second intermediate temperature level to a third intermediate temperature level that is below said first intermediate temperature level;
after performing said fourth temperature control step, and substantially without maintaining said process temperature at said third intermediate temperature level, performing a fifth temperature control step by operating said temperature reservoir to increase said process temperature from said third intermediate temperature level to a fourth intermediate temperature level that is below said second intermediate temperature level; and
after performing said fifth temperature control step, performing a sixth temperature control step by operating said temperature reservoir to decrease said process temperature from said fourth intermediate temperature level to a fifth intermediate temperature level that is less than said third intermediate temperature level.

21. The method of claim 9, wherein said temperature reservoir is operated to globally interact with said composite semiconductor device.

* * * * *